United States Patent
Chiu et al.

(10) Patent No.: US 8,802,992 B2
(45) Date of Patent: Aug. 12, 2014

(54) CIRCUIT BOARD MOUNTING APPARATUS

(75) Inventors: Po-Wen Chiu, New Taipei (TW); Wen-Hu Lu, Shenzhen (CN); Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 137 days.

(21) Appl. No.: 13/446,044

(22) Filed: Apr. 13, 2012

(65) Prior Publication Data

US 2013/0044449 A1 Feb. 21, 2013

(30) Foreign Application Priority Data

Aug. 19, 2011 (CN) .......................... 2011 1 0239731

(51) Int. Cl.
*H05K 3/30* (2006.01)
*H05K 7/12* (2006.01)
*H05K 7/14* (2006.01)

(52) U.S. Cl.
CPC ..................................... *H05K 7/142* (2013.01)
USPC ..................................... 174/138 G; 361/752

(58) Field of Classification Search
CPC .................. G06F 1/184; H05K 7/142
USPC .......................... 361/807, 810, 730, 752, 797; 174/138 D, 138 G
See application file for complete search history.

(56) References Cited

U.S. PATENT DOCUMENTS

| | | | |
|---|---|---|---|
| 5,661,640 A * | 8/1997 | Mills et al. | 361/801 |
| 6,377,445 B1 * | 4/2002 | Davis et al. | 361/752 |
| 6,639,804 B1 * | 10/2003 | Chen | 361/719 |
| 7,760,511 B2 * | 7/2010 | Sasaki et al. | 361/752 |
| 2008/0212293 A1 * | 9/2008 | Li et al. | 361/748 |
| 2013/0044445 A1 * | 2/2013 | Chiu et al. | 361/752 |
| 2013/0141852 A1 * | 6/2013 | Chen et al. | 361/679.4 |

* cited by examiner

*Primary Examiner* — Yuriy Semenenko
(74) *Attorney, Agent, or Firm* — Novak Druce Connolly Bove + Quigg LLP

(57) ABSTRACT

A circuit board mounting apparatus comprises a chassis and a securing structure. The chassis comprises a bottom board and two sidewalls located on two opposite sides of the board. The securing structure comprises a reinforcing member and a securing member secured to the reinforcing member. The reinforcing member is secured to the bottom board. The securing member defines a securing hole. A fixing member extends through a through hole defined in the circuit board to engage in the securing hole, for preventing the circuit board from moving laterally.

18 Claims, 6 Drawing Sheets

CIRCUIT BOARD MOUNTING APPARATUS

BACKGROUND

1. Technical Field

The present disclosure relates to mounting apparatuses, and particularly to a mounting apparatus for a circuit board.

2. Description of Related Art

In a computer or a server system, a mounting apparatus may be used to secure a circuit board. The mounting apparatus may include a chassis. The chassis may include a bottom board and two sidewalls located on the bottom board. The chassis may define a plurality of positioning holes. The circuit board may define a plurality of through holes corresponding to the positioning holes in the chassis. A plurality of screws may be inserted into the through holes and the positioning holes to secure the circuit board to the chassis. However, having the plurality of through holes on the circuit board may influence a layout of the circuit board and prevent an optimum layout.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
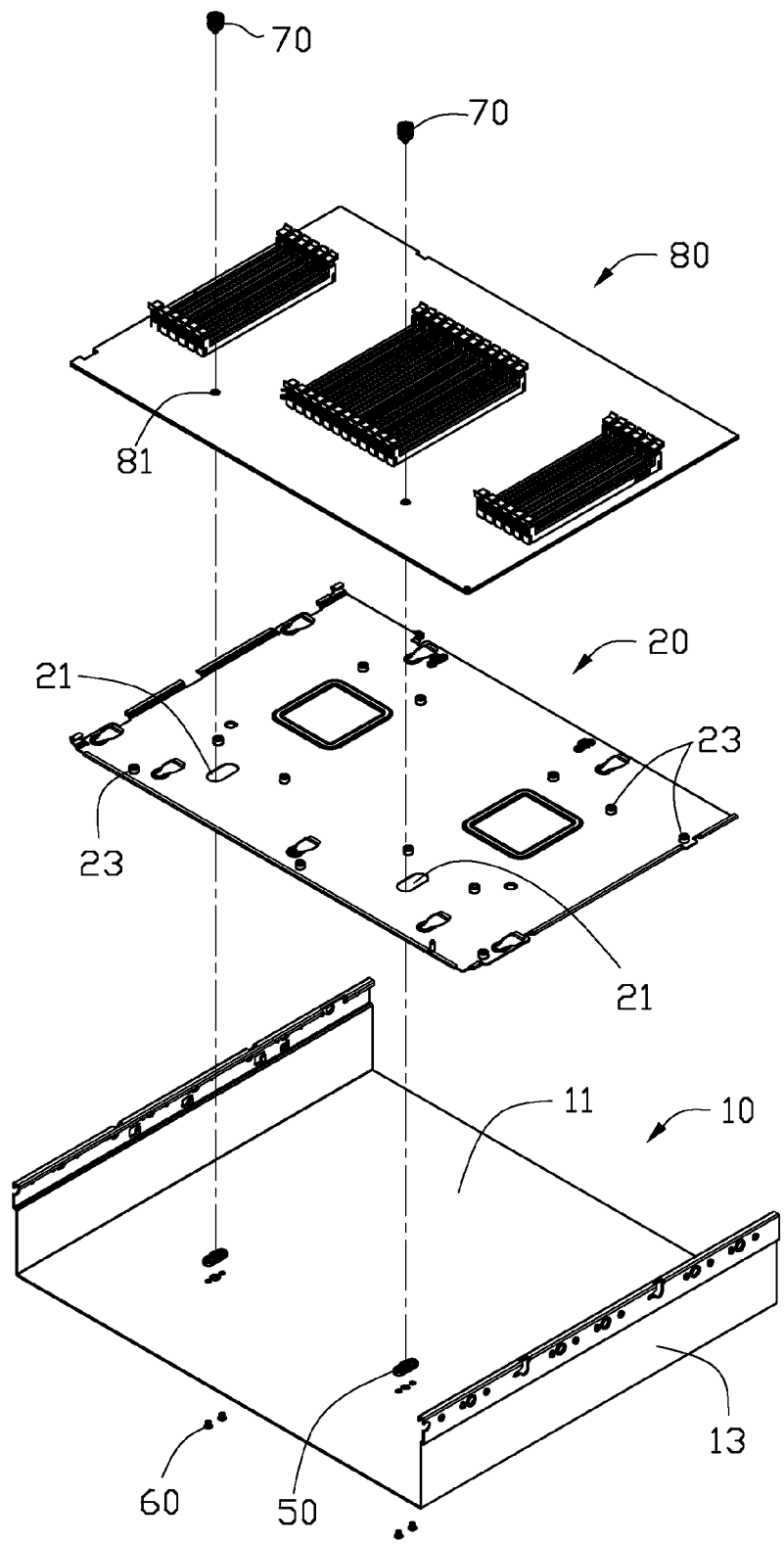
FIG. 1 is an exploded, isometric view of an embodiment of a mounting apparatus and a circuit board.

Referring to FIG. 1, a mounting apparatus in accordance with an embodiment for securing a circuit board 80, includes a chassis 10, a supporting plate 20 and two securing structures 50.

Figure 2:
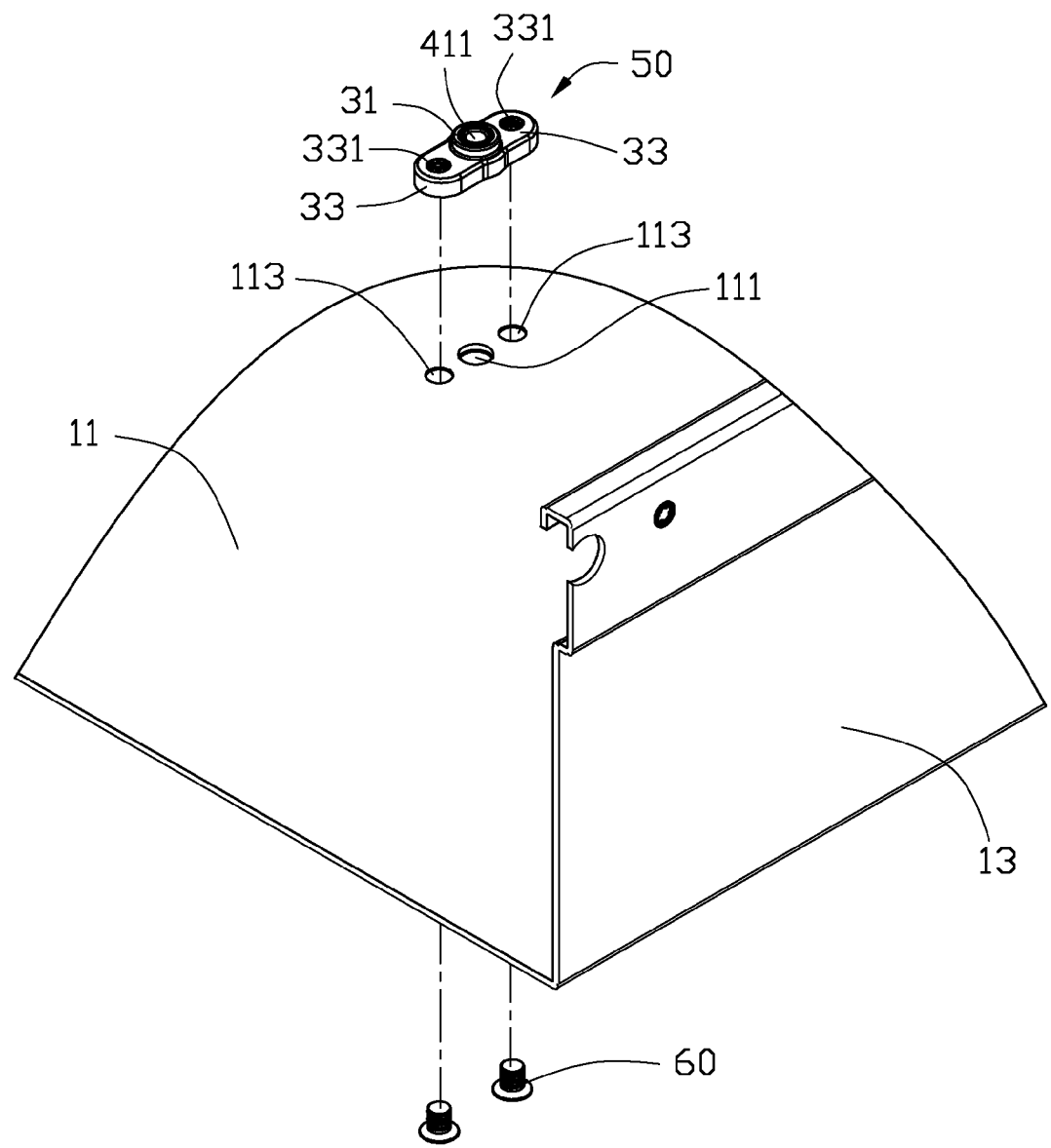
FIG. 2 is an exploded and cutaway, isometric view of a chassis and a securing structure of FIG. 1.

The chassis 10 includes a bottom board 11 and two side boards 13. The two side boards 13 are parallel to each other. In one embodiment, each of the two side boards 13 is substantially perpendicular to the bottom board 11. Referring to FIG. 2, the bottom board 11 defines a positioning hole 111 and two installation holes 113 corresponding to each of the two securing structures 50. The two installation holes 113 are located on two sides of the positioning hole 111. In one embodiment, a line (not shown) cutting diametrically through the two installation holes 113 and the positioning hole 111 between them is substantially parallel to the two side boards 13.

Figure 4:
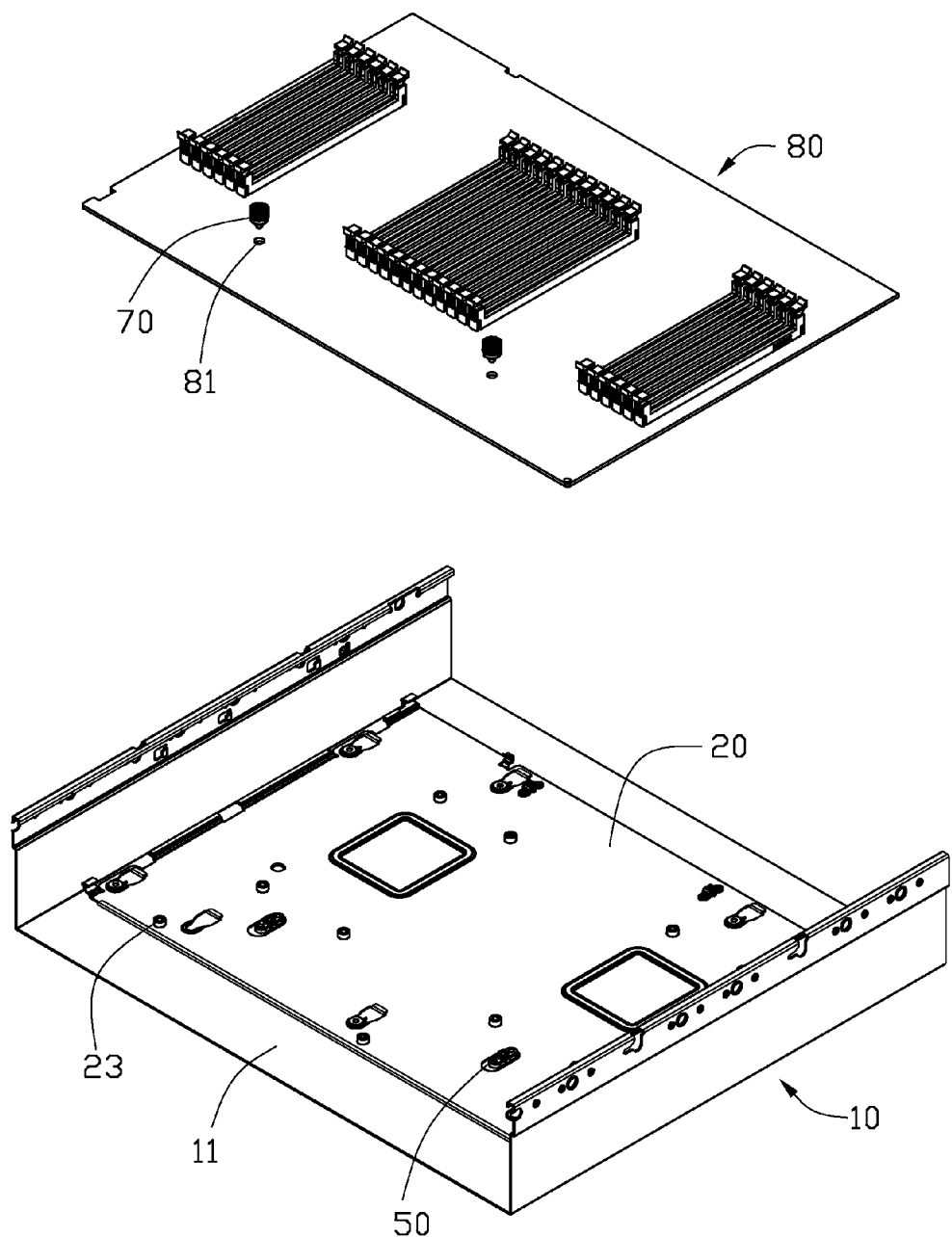
FIG. 4 is a partly assembled view of the mounting apparatus and the circuit board of FIG. 1.

Referring to FIGS. 1 and 4, the supporting plate 20 is secured to the bottom board 11 by fasteners, such as screws. The supporting plate 20 defines an opening 21 corresponding to each of the two securing structures 50. A plurality of pillars 23 are located on the supporting plate 20 for supporting the circuit board 80.

Figure 3:
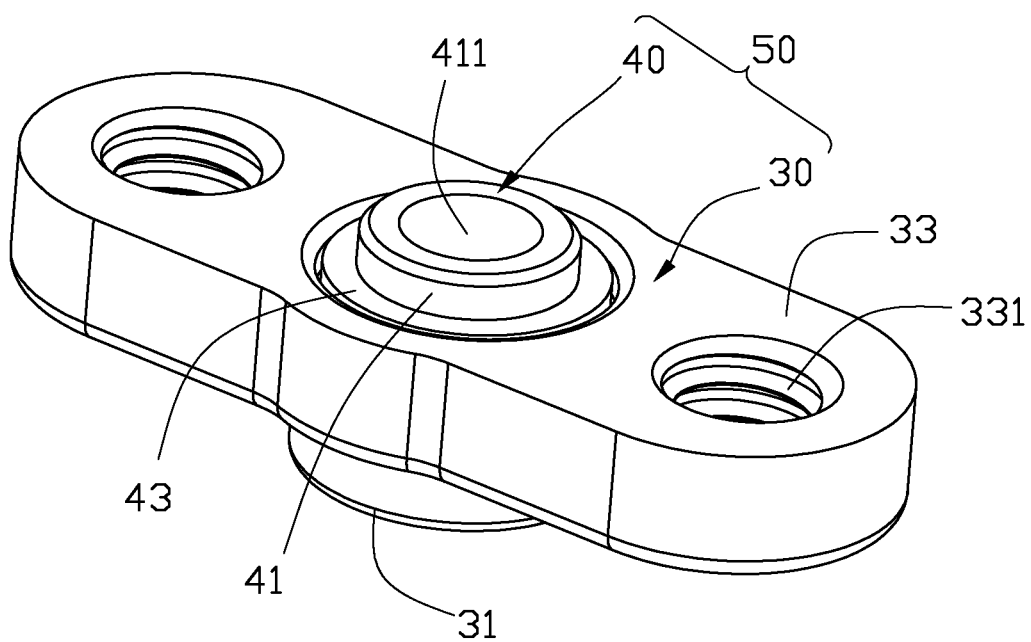
FIG. 3 is an isometric view of the securing structure of FIG. 1.
Figure 6:
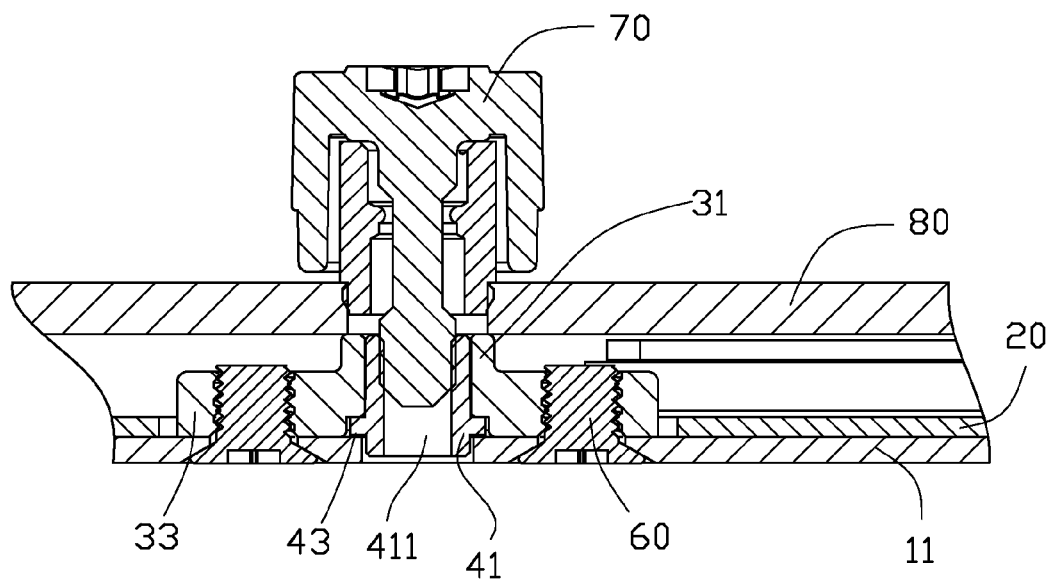
FIG. 6 is a cross-sectional view of the mounting board and the circuit board of FIG. 5, taken along the line VI-VI.

Referring to FIGS. 3 and 6, each of the two securing structures 50 includes a reinforcing member 30 and a securing member 40 secured to the reinforcing member 30. The reinforcing member 30 includes a reinforcing portion 31 and two limiting portions 33 extending from two opposite sides of the reinforcing portion 31. In one embodiment, the reinforcing portion 31 is substantially hollow-columnar. Each of the two limiting portions 33 defines a limiting hole 331.

The securing member 40 includes a securing portion 41 and a stopping portion 43 extending from the securing portion 41. The securing member 40 is engaged with the reinforcing portion 31 as interference fit. The securing portion 41 defines a securing hole 411. In one embodiment, a central axis (not shown) is defined in each of the two securing structures 50.

Referring to FIG. 1, the circuit board 80 defines a through hole 81 to match the securing hole 411.

Figure 5:
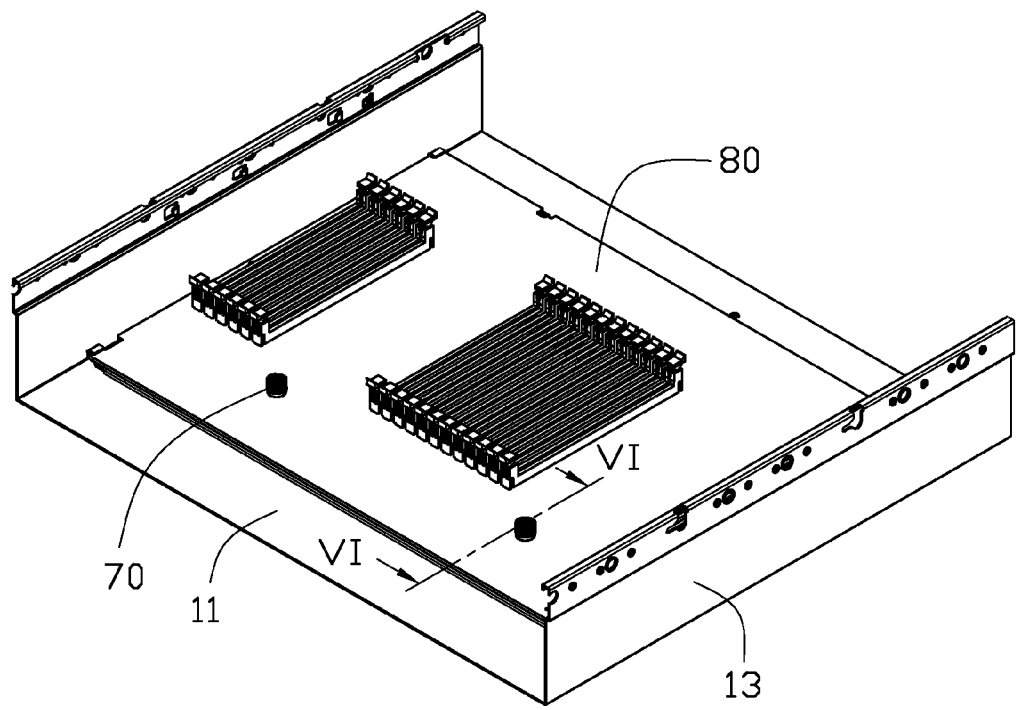
FIG. 5 is an assembled view of the mounting apparatus and the circuit board of FIG. 1.

Referring to FIGS. 5-6, in assembly, each of the two securing structures 50 is placed on the bottom board 11 and received in the opening 21 of the supporting plate 20. The stopping portion 43 is inserted into the positioning hole 111. Each of the two securing structures 50 is rotated around the central axis to the limiting hole 331 aligned with each of the installation holes 113. A locking member 60 is inserted into each of the two installation holes 113 and the limiting hole 331, and each of the two securing structures 50 is thereby installed on the chassis 10.

In assembly of the circuit board 80, the circuit board 80 is placed on the plurality of pillars 23 and the reinforcing portion 31. The through hole 81 is aligned with the securing hole 411, and a fixing member 70 is inserted into the through hole 81 and the securing hole 411. The circuit board 80 is thereby secured to the chassis 10.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A circuit board mounting apparatus comprising:
a chassis comprising a bottom board and two sidewalls located on two opposite sides of the bottom board; and
a securing structure comprising a reinforcing member and a securing member secured to the reinforcing member, the reinforcing member secured to the bottom board, the securing member defining a securing hole, the securing member comprising a securing portion and a stopping portion substantially perpendicular to the securing portion, the stopping portion abutting the bottom board, the stopping portion and the reinforcing member being located on a same side of the bottom board, and a fixing member extending through a through hole defined in a circuit board to engage in the securing hole so that the circuit board is prevented from moving relative to the bottom board along a direction parallel to the two sidewalls.

2. The circuit board mounting apparatus of claim 1, wherein the bottom board defines a positioning hole, and the securing portion is engaged in the positioning hole.

3. The circuit board mounting apparatus of claim 2, wherein the reinforcing member comprises a reinforcing portion configured to support the circuit board, and the securing portion is engaged with the reinforcing portion.

4. The circuit board mounting apparatus of claim 2, wherein the reinforcing member further comprises two limiting portions, each of the two limiting portions defines a limiting hole, the bottom board defines an installation hole corresponding to the limiting hole, and the reinforcing member is secured to the bottom board by inserting a locking member into each of the two limiting holes and the installation hole.

5. The circuit board mounting apparatus of claim 4, wherein a line cutting diametrically through the two installation holes and the positioning hole between them is substantially parallel to the two side boards.

6. The circuit board mounting apparatus of claim 1 further comprises a supporting plate secured to the bottom board, the supporting plate defines an opening, and the securing structure is received in the opening.

7. The circuit board mounting apparatus of claim 6, wherein a plurality of pillars is located on the supporting plate, and the plurality of pillars is configured to support the circuit board.

8. The circuit board mounting apparatus of claim 1, wherein the securing member is secured to the reinforcing member by interference fit.

9. The circuit board mounting apparatus of claim 2, wherein the stopping portion extends into a recess of the reinforcing member.

10. A circuit board mounting apparatus comprising:
    a chassis comprising a bottom board and two sidewalls located on two opposite sides of the bottom board;
    a supporting plate defining an opening; and
    a securing structure received in the opening, the securing structure comprising a reinforcing member and a securing member secured to the reinforcing member, the reinforcing member secured to the bottom board, the securing member comprising a securing portion and a stopping portion substantially perpendicular to the securing portion, the stopping portion extends into the reinforcing member, the stopping portion abutting the bottom board, the securing member defining a securing hole, and a fixing member extends through a through hole defined in a circuit board to engage in the securing hole so that the circuit board is prevented from moving relative to the bottom board along a direction parallel to the two sidewalls.

11. The circuit board mounting apparatus of claim 10, wherein the bottom board defines a positioning hole, and the securing portion is engaged in the positioning hole.

12. The circuit board mounting apparatus of claim 11, wherein the reinforcing member comprises a reinforcing portion, and an outside wall of the securing portion is engaged with an inside wall of the reinforcing portion.

13. The circuit board mounting apparatus of claim 11, wherein the reinforcing member further comprises two limiting portions, each of the two limiting portions defines a limiting hole, the bottom board defines an installation hole corresponding to the limiting hole, and the reinforcing member is secured to the bottom board by inserting a locking member into each of the two limiting holes and the installation hole.

14. The circuit board mounting apparatus of claim 13, wherein a line cutting diametrically through the two installation holes and the positioning hole between them is substantially parallel to the two side boards.

15. The circuit board mounting apparatus of claim 12, wherein the reinforcing portion is substantially hollow-columnar.

16. The circuit board mounting apparatus of claim 10, wherein a plurality of pillars is located on the supporting plate, the plurality of pillars is configured to support the circuit board.

17. The circuit board mounting apparatus of claim 10, wherein the securing member is secured to the reinforcing member by interference fit.

18. The circuit board mounting apparatus of claim 11, wherein the stopping portion and the reinforcing member are located on a same side of the bottom board.

* * * * *